United States Patent
Brandenburg et al.

(10) Patent No.: US 6,779,260 B1
(45) Date of Patent: Aug. 24, 2004

(54) OVERMOLDED ELECTRONIC PACKAGE INCLUDING CIRCUIT-CARRYING SUBSTRATE

(75) Inventors: Scott D. Brandenburg, Kokomo, IN (US); Thomas A. Degenkolb, Noblesville, IN (US); Bruce A. Myers, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/401,850

(22) Filed: Mar. 28, 2003

(51) Int. Cl.$^7$ ................................................ A05K 3/30
(52) U.S. Cl. .......................... 29/841; 29/827; 29/832; 29/840; 174/52.2; 174/52.4
(58) Field of Search .......................... 29/827, 832, 840, 29/841; 174/52.2, 52.4

(56) References Cited

U.S. PATENT DOCUMENTS

| | | | | |
|---|---|---|---|---|
| 3,509,430 A | * | 4/1970 | Mroz | 257/702 |
| 3,706,840 A | * | 12/1972 | Moyle et al. | 174/52.2 |
| 4,633,573 A | * | 1/1987 | Scherer | 29/841 |
| 4,701,999 A | * | 10/1987 | Palmer | 29/827 |
| 4,763,407 A | * | 8/1988 | Abe | 29/840 |
| 5,376,824 A | * | 12/1994 | Rauchmaul et al. | 257/666 |
| 5,406,699 A | * | 4/1995 | Oyama | 29/827 |
| 5,525,834 A | * | 6/1996 | Fischer et al. | 257/691 |
| 6,180,045 B1 | | 1/2001 | Brandenburg et al. | |
| 6,285,551 B1 | | 9/2001 | Brandenburg et al. | |
| 6,307,749 B1 | | 10/2001 | Daanen et al. | |

* cited by examiner

*Primary Examiner*—Carl J. Arbes
(74) *Attorney, Agent, or Firm*—Stefan V. Chmielewski

(57) ABSTRACT

An overmolded electronic package includes a circuit-carrying substrate and a connector housing or shroud interconnected via a suitable interconnection arrangement. Some embodiments may include a backplate affixed to the substrate and, in some cases, also to the connector housing or shroud. In some embodiments, the connector housing or shroud may be affixed to the substrate, and in any case the entire subassembly of components is overmolded with a rigidly formable molding compound to bond together all components of the subassembly and form the overmolded electronic package. The subassembly of components with the exception of the backplate may alternatively be overmolded with the molding compound, and a backplate thereafter affixed to the subassembly via a compliant bonding medium.

32 Claims, 5 Drawing Sheets

OVERMOLDED ELECTRONIC PACKAGE INCLUDING CIRCUIT-CARRYING SUBSTRATE

TECHNICAL FIELD

The present invention relates generally to techniques for packaging electronic circuitry, and more specifically to techniques for packaging circuit-carrying substrates interconnected to one or more connector pins of a connector housing or shroud.

BACKGROUND OF THE INVENTION

Circuit-carrying substrates typically require protection from the environment and an electrical interface to external components and/or systems. In an effort to achieve and also to improve on these two goals, a number of electronic packaging techniques have been implemented. FIG. 1 illustrates a cross-section of one example of a popular conventional electronic package 10 having a circuit-carrying substrate 24 mounted therein and operatively connected to a number of electrical connector pins 20. Package 10 includes a housing 14, typically formed of a plastic resin, affixed to a substrate 12, typically formed of metal, via an adhesive layer 16. The housing 14 defines a connector shroud cavity 18 housing one or more electrical connector pins 20, and the one or more pins 20 extend into a cavity 22 defined by the housing 14. A circuit-carrying substrate 24, typically formed of a ceramic material such as alumina, is affixed to the backplate 12 within the cavity 22 via an appropriate adhesive or epoxy 26, which is typically thermally conductive to provide an adequate heat sink between the substrate 24 and backplate 12. Alternatively, layer 26 may represent a solder connection between the substrate 24 and backplate 12.

The substrate 24 may carry a number of electrical components, and two such components 28 and 30 are illustrated in FIG. 1. Component 28 represents a printed resistor and component 30 represents an integrated circuit mounted to substrate 24 using conventional flip chip technology; i.e., conductive "bumps" are formed on the bond pads of the integrated circuit 30, and the circuit 30 is then mounted to the substrate 24 with its circuit-defining surface facing substrate 30 such that the bumps align with and contact electrically conductive circuit pads or leads defined on the substrate 24. The bumps are thereafter bonded to the circuit pads or leads in a known manner to mechanically and electrically connect the integrated circuit 30 to the substrate 24. Because the mechanical connection between the integrated circuit 30 and the substrate 24 is made only via the bonds between the bumps and the circuit pads or leads, the gap between the integrated circuit 30 and substrate 24 is typically filled with a conventional formable underfill medium 36 that bonds to the circuit-carrying surface of the integrated circuit 30 and to the substrate 24 to thereby secure the mechanical connection therebetween. The underfill process, conventionally carried out via a known capillary underfill technique, is typically carried out before the substrate 24 is mounted to the backplate 12.

The substrate defines thereon a number of bonding locations 32, and wirebonds 34, typically formed of aluminum, are attached between the various bonding locations 32 and corresponding ones of the electrical connector pins 20 extending through the housing 14 into the cavity 22. The cavity 22 is typically filled with a circuit-protecting, pliable, gel-like medium or circuit passivation material 38, and a cap or cover 40 is then mounted to the housing 14 via a suitable adhesive 42. A vent hole 44 is typically provided through the cap 40 to allow for outgassing of one or more of the materials housed within the cavity 22.

Referring to FIG. 2, a flowchart is shown illustrating a typical process 50 for constructing the electronic package 10 of FIG. 1, and process 50 begins at step 52 where any flip-chip mounted integrated circuits 30 carried by the substrate 24 are underfilled as described to secure mechanical connection therebetween. At step 54, the backplate 12 is attached to the housing 14 via adhesive layer 16, and thereafter at step 56 the circuit-carrying substrate 24 is attached to the backplate 12 within the housing cavity 22 via adhesive layer 26. Following step 56, the housing leads or pins 20 are wirebonded to the bonding locations 32 on the substrate 24 at step 58, and thereafter at step 60 the housing cavity 22 is filled with the circuit passivation material 38 and the cover or cap 40 is then mounted to the housing 14 at step 62 via adhesive layer 42.

The electronic package 50 illustrated in FIG. 1 and described hereinabove utilizes complex housing and interconnect designs, and the process of constructing package 50 involves multiple adhesive and formable medium dispense and cure operations. It is accordingly desirable to simplify the package structure and associated manufacturing processes to decrease the cost and complexity, and also to eliminate shortcomings, associated with conventional electronic packages and interconnect configurations.

SUMMARY OF THE INVENTION

The present invention comprises one or more of the following features or combinations thereof. A method of forming an overmolded electronic package including a circuit-carrying substrate may comprise the steps of providing a housing defining a cavity therein and defining a connector shroud having a number of electrically conductive leads extending into the cavity, attaching the housing to a backplate, attaching the circuit-carrying substrate to the backplate within the housing cavity, connecting the number of electrically conductive leads to corresponding conductive pads defined on the substrate, filling the cavity with a rigidly formable molding compound and curing the formable molding compound. The connecting step may comprise wirebonding the number of electrically conductive leads to the corresponding conductive pads defined on the substrate to rigidly bond together the backplate, substrate and the housing to form the overmolded electronic package.

The method may further include the step of applying an adhesion promoting layer to a circuit-carrying side of the substrate prior to the filling step, wherein the adhesion promoting layer promotes adhesion between the circuit-carrying side of the substrate and the formable molding compound.

The circuit-carrying side of the substrate may have at least one flip chip mounted thereto with the at least one flip chip and the substrate defining a space therebetween, and the formable molding compound may be configured to flow between the at least one flip chip and the substrate and fill the space prior to the curing step.

The formable molding compound may be configured to exhibit a coefficient of thermal expansion that is near that of the substrate.

Another method of forming an overmolded electronic package including a circuit-carrying substrate may comprise the steps of providing a connector shroud having a number of electrically conductive leads extending therethrough, attaching the connector shroud to one of a backplate and the circuit-carrying substrate, attaching the circuit-carrying substrate to the backplate, connecting the number of electrically conductive leads to corresponding conductive pads defined on the substrate, and overmolding at least the connector shroud and the circuit-carrying substrate with a rigidly formable molding compound to form the overmolded electronic package. The step of attaching the connector shroud may comprise attaching the connector shroud only to the backplate, wherein the overmolding step includes overmolding the connector shroud, the circuit-carrying substrate and the backplate with the rigidly formable molding compound to form the overmolded electronic package. Alternatively, the step of attaching the connector shroud may comprise attaching the connector shroud only to the circuit-carrying substrate, wherein the overmolding step includes overmolding the connector shroud, the circuit-carrying substrate and the backplate with the rigidly formable molding compound to form the overmolded electronic package. Alternatively still, the step of attaching the connector shroud may comprise attaching the connector shroud only to the circuit-carrying substrate, wherein the overmolding step includes overmolding only the connector shroud and the circuit-carrying substrate with the rigidly formable molding compound to form the overmolded electronic package, and wherein the step of attaching the circuit-carrying substrate is executed after the overmolding step.

The connecting step may comprise wirebonding, solder connecting or otherwise electrically and mechanically attaching the number of electrically conductive leads to the corresponding conductive pads defined on the substrate.

The method may further include the step of applying an adhesion promoting layer to a circuit-carrying side of the substrate prior to the overmolding step, the adhesion promoting layer promoting adhesion between the circuit-carrying side of the substrate and the formable molding compound.

The circuit-carrying side of the substrate may have at least one flip chip mounted thereto, the at least one flip chip and the substrate defining a space therebetween, wherein the formable molding compound is configured to flow between the at least one flip chip and the substrate and fill the space.

The formable molding compound may be configured to exhibit a coefficient of thermal expansion that is near that of the substrate.

Yet another method of forming an overmolded electronic package including a circuit-carrying substrate may comprise the steps of attaching the circuit-carrying substrate to a backplate, providing a connector shroud having a number of electrically conductive leads extending therethrough, connecting the number of electrically conductive leads to corresponding conductive pads defined on the substrate, and overmolding at least the connector shroud and the circuit-carrying substrate with a rigidly formable molding compound to form the overmolded electronic package. The overmolding step may include overmolding the connector shroud, the circuit-carrying substrate and the backplate with the rigidly formable molding compound to form the overmolded electronic package. Alternatively, the overmolding step may include overmolding only the connector shroud and the circuit-carrying substrate with the rigidly formable molding compound to form the overmolded electronic package, wherein the step of attaching the circuit-carrying substrate is executed after the overmolding step.

The connecting step may comprise any known lead-connecting process including providing a solder mass between each of the number of electrically conductive leads and the corresponding conductive pads defined on the substrate, and reflowing the solder masses to electrically and mechanically connect the number of electrically conductive leads to the corresponding conductive pads defined on the substrate.

The method may further include the step of applying an adhesion promoting layer to a circuit-carrying side of the substrate prior to the overmolding step, the adhesion promoting layer promoting adhesion between the circuit-carrying side of the substrate and the formable molding compound.

The circuit-carrying side of the substrate may have at least one flip chip mounted thereto, the at least one flip chip and the substrate defining a space therebetween, wherein the formable molding compound is configured to flow between the at least one flip chip and the substrate and fill the space.

The formable molding compound may be configured to exhibit a coefficient of thermal expansion that is near that of the substrate.

Still another method of forming an overmolded electronic package including a circuit-carrying substrate may comprise the steps of providing a connector shroud having a number of electrically conductive leads extending therethrough, connecting the number of electrically conductive leads to corresponding conductive pads defined on the circuit-carrying substrate, overmolding the connector shroud and circuit-carrying substrate with a rigidly formable molding compound while leaving at least partially exposed an underside of the connector shroud and an underside of the circuit-carrying substrate, and attaching a backplate to the undersides of the connector shroud and the substrate after the overmolding step to form the overmolded electronic package.

The connecting step may comprise any known lead-connecting process including providing a solder mass between each of the number of electrically conductive leads and the corresponding conductive pads defined on the substrate, and reflowing the solder masses to electrically and mechanically connect the number of electrically conductive leads to the corresponding conductive pads defined on the substrate.

The method may further include the step of applying an adhesion promoting layer to a circuit-carrying side of the substrate prior to the overmolding step, the adhesion promoting layer promoting adhesion between the circuit-carrying side of the substrate and the formable molding compound.

The circuit-carrying side of the substrate may have at least one flip chip mounted thereto, the at least one flip chip and the substrate defining a space therebetween, wherein the formable molding compound is configured to flow between the at least one flip chip and the substrate and fill the space.

The formable molding compound is configured to exhibit a coefficient of thermal expansion that is near that of the substrate.

A further method of forming an overmolded electronic package including a circuit-carrying substrate having a number of flip-chip circuits mounted thereto may comprise the steps of providing a backplate having a number of thermally conductive posts extending therefrom, attaching the circuit-carrying substrate to the backplate with each of the number of flip-chip circuits mounted to a corresponding one of the number of thermally conductive posts, providing a connector shroud having a number of electrically conductive leads extending therethrough, connecting the number of electrically conductive leads to corresponding conductive pads defined on the substrate, and overmolding the connector shroud, the circuit-carrying substrate and the backplate with a rigidly formable molding compound to form the overmolded electronic package.

The method may further include the step of applying a formable thermally conductive medium between each of the number of flip-chip circuits and a corresponding one of the number of thermally conductive posts.

The method may further include the step of attaching the connector shroud to the circuit-carrying substrate.

The method may further include the step of applying an adhesion promoting layer to a circuit-carrying side of the substrate prior to the overmolding step, the adhesion promoting layer promoting adhesion between the circuit-carrying side of the substrate and the formable molding compound.

Each of the number of flip-chip circuits and the substrate define a space therebetween, wherein the formable molding compound is configured to flow between the number of flip-chip circuits and the substrate and fill the spaces.

The formable molding compound may be configured to exhibit a coefficient of thermal expansion that is near that of the substrate.

The connecting step may comprise any known lead-connecting process including providing a solder mass between each of the number of electrically conductive leads and the corresponding conductive pads defined on the substrate, and reflowing the solder masses to electrically and mechanically connect the number of electrically conductive leads to the corresponding conductive pads defined on the substrate.

These and other features of the present invention will become more apparent from the following description of the illustrative embodiments.

DESCRIPTION OF THE ILLUSTRATIVE EMBODIMENTS

Figure 1:
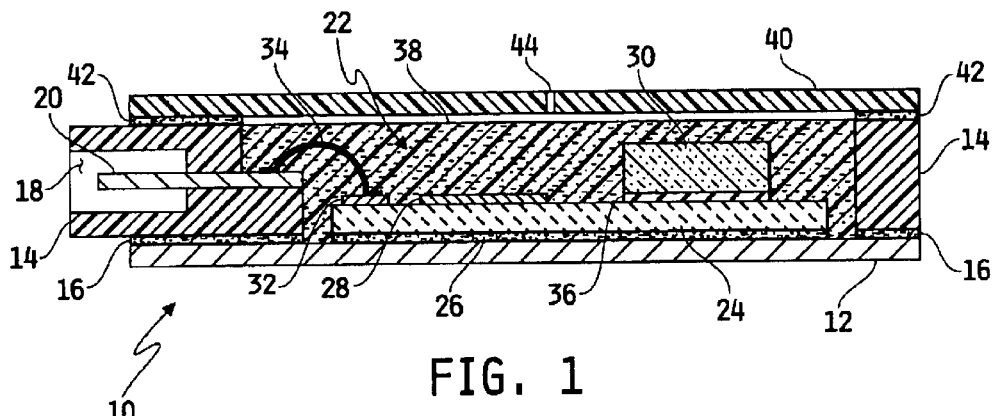
FIG. 1 is a cross-sectional view of a conventional electronic package including a circuit-carrying substrate.
Figure 3:
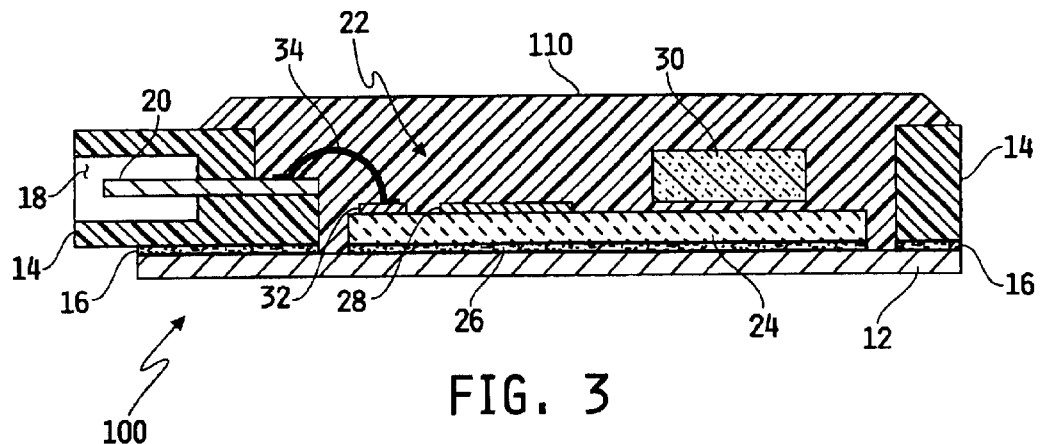
FIG. 3 is a cross-sectional view of one embodiment of an overmolded electronic package including a circuit-carrying substrate.

Referring now to FIG. 3, a cross-sectional view of one embodiment of an overmolded electronic package 100 is shown including a circuit-carrying substrate 24. Some of the elements of FIG. 3 are identical to those illustrated in FIG. 1, and like numbers are therefore used to identify like components. For example, package 100 includes a housing 14 affixed to a backplate 12 via a suitable bonding medium 16, and a circuit-carrying substrate 24 affixed to the backplate 12 within the cavity 22 formed by the housing 14 via suitable bonding medium 26, and a number of bonding locations 32 defined on the substrate 24 are electrically connected to conductive connector pins 20 extending into cavity 22 via wirebonds 34. Unlike the electronic package 10 of FIG. 1, however, the cavity 22 of the electronic package 100 is filled with a rigidly formable molding compound 110. The molding compound 110 bonds to all surfaces that it contacts, and when cured it rigidly secures the housing 14, backplate 12, substrate 24 and wirebonds 34 together to form a sealed electronic package 100. Those skilled in the art will recognize that substrate 24 may be coated with an oxide dielectric material (e.g., Lead Oxide) as part of the conventional substrate/circuit fabrication process, and in such cases the substrate 24 and circuitry carried thereby may be pre-coated with a known adhesion promoting layer (e.g., polyimide) before mounting the substrate 24 to the backplate 12 to thereby promote adhesion and bonding between the substrate 24 and formable molding compound 110.

It should be noted that in the electronic package 100 illustrated in FIG. 3 (and in all other electronic package embodiments illustrated and described hereinafter), the formable molding compound 110 replaces the underfill medium 36 between the integrated circuit 30 and the substrate 24. It is accordingly desirable to formulate the formable molding compound 110 with a suitably low viscosity such that it is able to flow into the space between the integrated circuit 30 and the substrate 24 during the overmolding process. Also, as with the underfill medium 36, the formable molding compound 110 forms a bond to the integrated circuit 30 and to the substrate 24 to secure and maintain the mechanical connection therebetween. It is therefore further desirable to formulate the formable molding compound 110 such that its coefficient of thermal expansion (hereinafter CTE) more closely matches that of the substrate 24 to minimize, or at least reduce the likelihood of, failure of the electrical interconnects (e.g., solder bumps) between the integrated circuit 30 and the substrate 24 resulting from temperature excursions. For example, some integrated circuits 30 have CTEs as high as 3–4 ppm/° C., while typical materials used for substrate 24 (e.g., alumina) have CTEs in the range of 6–8 ppm/° C. Typical capillary underfill formulations 36 have CTEs in the range of 25–30 ppm/° C., and may therefore exacerbate the rate of interconnect fatigue failures by facilitating movement of the integrated circuits 30 relative to the substrate 24 during temperature changes. It is therefore desirable to formulate the formable molding compound 110 such that its CTE is closer to that of the substrate 24, and in one embodiment the CTE of the molding compound is 6–8 ppm/° C. The molding compound 110 completely envelops the integrated circuit 30, and will accordingly secure the circuit 30 to the substrate 24. It is generally understood that the CTE of the molding compound 110 generally decreases with increasing filler content (e.g., silica filler), but that this also generally increases its viscosity. Those skilled in the art will accordingly recognize that the formulation of the formable molding compound 110 used for any particular application will generally require a compromise between its CTE and its pre-cured viscosity. Such formable molding compound 110 is commercially available from a number of manufacturers in a number of countries, and one domestic supplier of such molding compound 110 is Cookson Semiconductor, Inc. of Alpharetta, Ga.

Figure 2:
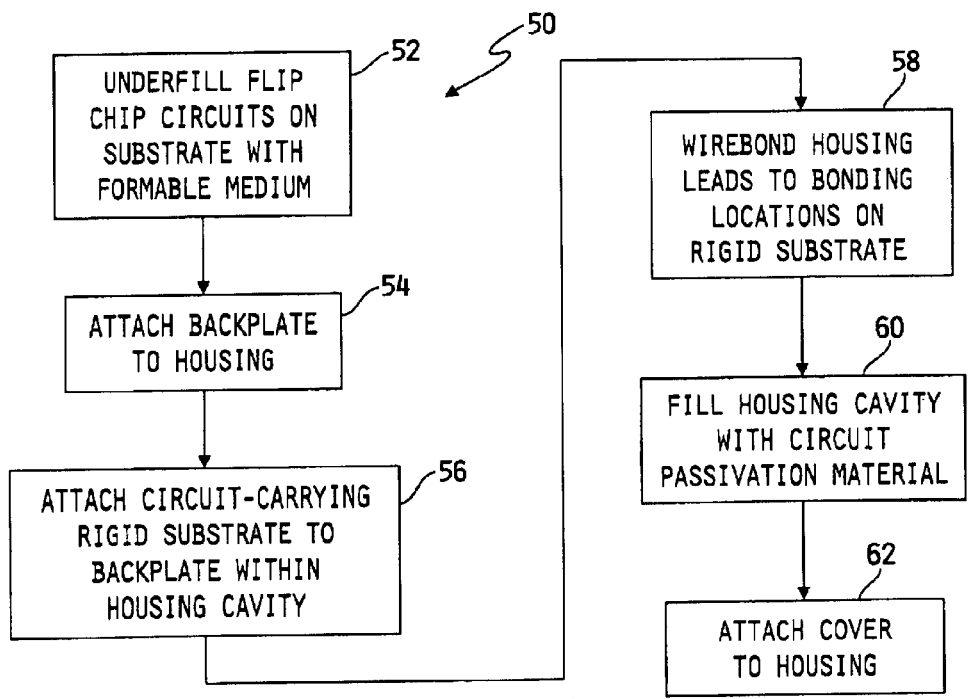
FIG. 2 is a flowchart illustrating one known process for constructing the conventional electronic package of FIG. 1.
Figure 4:
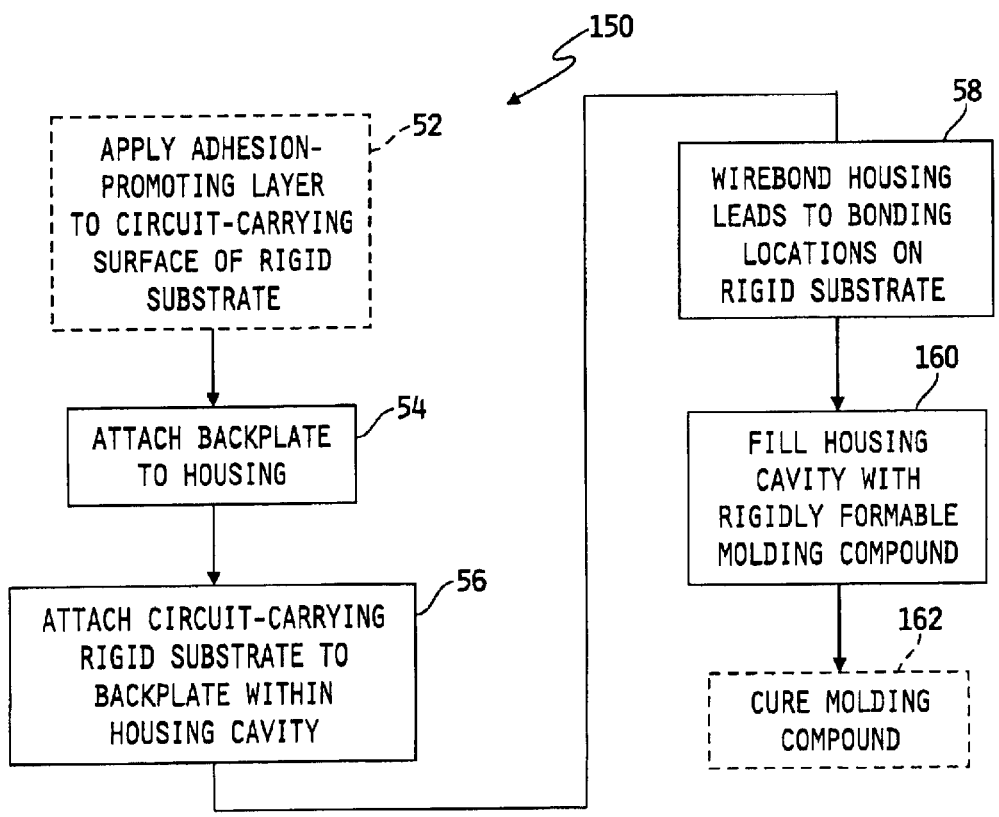
FIG. 4 is a flowchart illustrating a process for constructing the overmolded electronic package of FIG. 3.

Referring now to FIG. 4, a flowchart is shown illustrating a process 150 for constructing the overmolded electronic package 100 of FIG. 3. Some of the steps of process 150 are identical to those of process 50 illustrated in FIG. 2, and like numbers are accordingly used in FIG. 4 to identify like steps. Process 150 begins with an optional step 152 of applying an adhesion-promoting layer to the circuit-carrying surface of substrate 24. At step 54, the backplate 12 is attached to the housing 14 via a suitable bonding medium 16. Thereafter at step 56, the circuit-carrying substrate 24 is attached to the backplate 12 within the housing cavity 22 via a suitable bonding medium 26. Thereafter at step 58, the connector pins 20 extending into the housing cavity 22 are attached via wirebonds 34 to corresponding bonding locations 32 defined on the substrate 24. Following step 58, process 150 advances to step 160 where the cavity 22 of housing 14 is filled with the rigidly formable molding compound 110 in a manner that allows it to fill the space between the integrated circuit 30 and the substrate 24. The molding compound filling the housing cavity 160 may configured to cure and set on its own, or may require a curing step to set the compound to a state. Optional step 162 may accordingly be included, as shown by the dashed-line process block, wherein the molding compound 110 is cured at step 162 to form a electronic package 100 bonding together the backplate 12, housing 14 (and associated circuitry 28, 30), substrate 24, and wirebond(s) 34.

Figure 5:
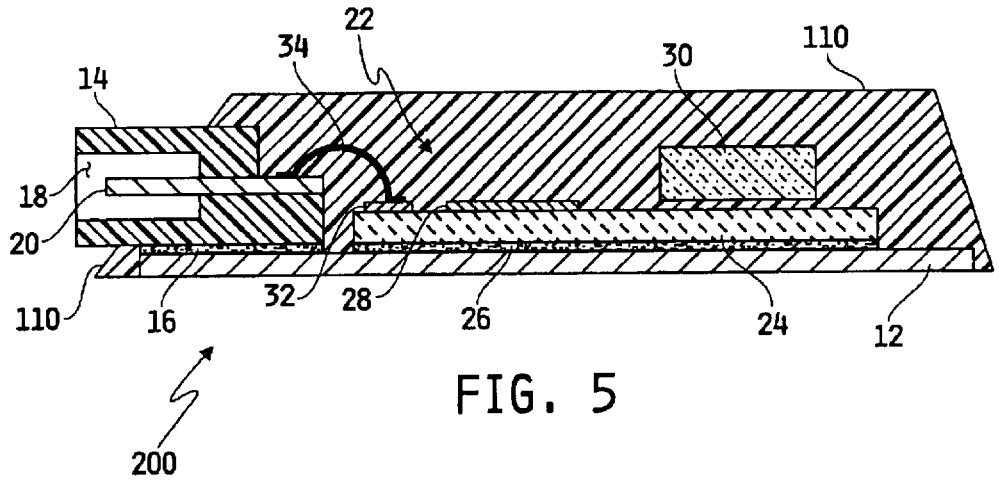
FIG. 5 is a cross-sectional view of another embodiment of an overmolded electronic package including a circuit-carrying substrate.

Referring now to FIG. 5, a cross-sectional view of another embodiment of an overmolded electronic package 200 is shown including the circuit-carrying substrate 24. Some of the elements of FIG. 5 are identical to those illustrated in FIGS. 1 and/or 3, and like numbers are therefore used to identify like components. For example, package 200 includes a backplate 12 mounted via a suitable bonding medium 26 to a circuit-carrying substrate 24. In this case, the full housing 14 is not required, and is instead replaced by a connector shroud 14' defining the connector cavity 18 therein which houses the one or more connector pins 20 extending through the shroud 14'. The connector shroud 14' is attached to the backplate 12 via a suitable bonding medium 16 such that the one or more connector pins 20 extending through the shroud 14' are positioned adjacent to the substrate 24. As with the embodiments 10 and 100 illustrated in FIGS. 1 and 3 respectively, the number of bonding locations 32 defined on the substrate 24 are electrically connected to the conductive connector pins 20 via wirebonds 34. Unlike the electronic packages 10 and 100 of FIGS. 1 and 3 respectively, however, the backplate 12, substrate 24 (and circuitry carried thereby), connector shroud 14' and wirebonds 34 are all bonded together with the rigidly formable molding compound 110 in accordance with a conventional overmolding process; e.g., a transfer molding process commonly known and used in the electronics packaging industry.

Figure 6:
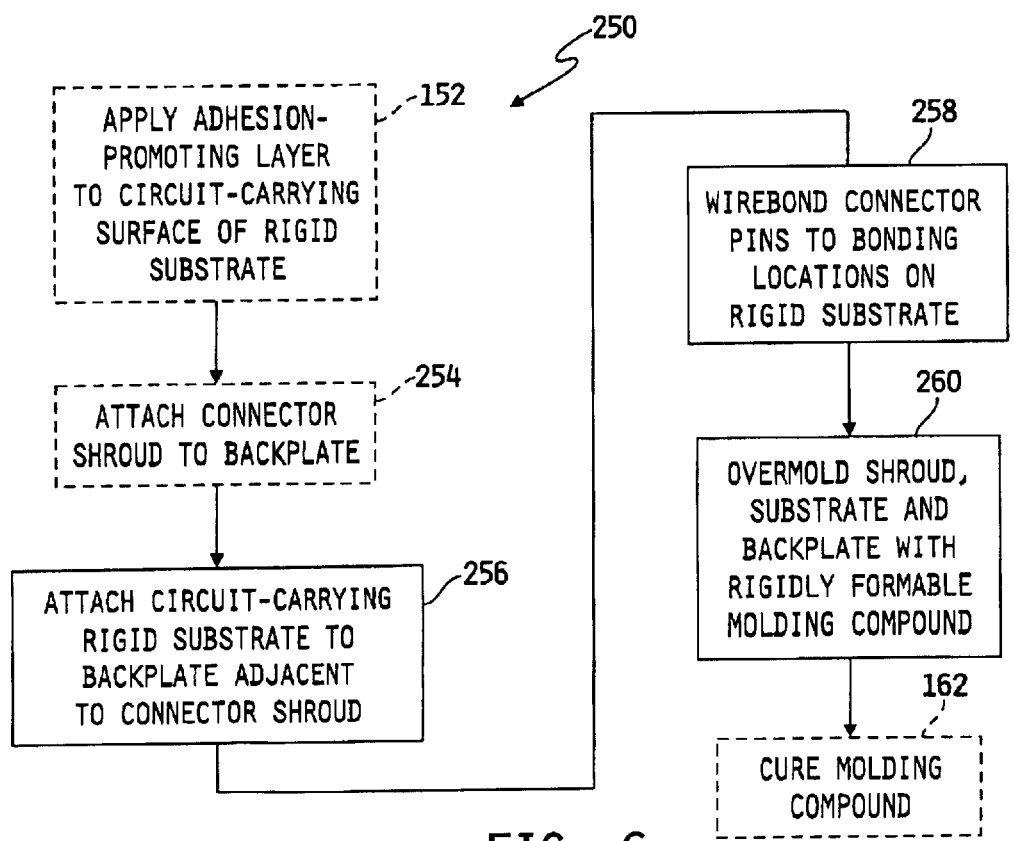
FIG. 6 is a flowchart illustrating a process for constructing the overmolded electronic package of FIG. 5.

Referring now to FIG. 6, a flowchart is shown illustrating a process 250 for constructing the overmolded electronic package 200 of FIG. 5. As with process 150, process 250 begins with an optional step 152 of applying an adhesion-promoting layer to the circuit-carrying surface of substrate 24. Thereafter at step 254, or beginning with step 254 if step 152 is omitted, the backplate 12 is attached to the connector shroud 14' via a suitable bonding medium 16. Thereafter at step 256, the circuit-carrying substrate 24 is attached to the backplate 12 adjacent to the connector shroud 14' via a suitable bonding medium 26. Those skilled in the art will recognize that the sequence of steps 254 and 256 illustrated in FIG. 5 represent only one illustrative embodiment of process 250, and the steps 254 and 256 may be alternatively reversed in sequence. Following step 256, process 250 advances to step 258 where the connector pins 20 extending from the connector shroud 14' toward the substrate 24 are attached via wirebonds 34 to corresponding bonding locations 32 defined on the substrate 24. Thereafter at step 260, the subassembly comprising the connector shroud 14', substrate 24 (including circuitry carried thereby), backplate 12 and wirebonds 34 is overmolded with the rigidly formable molding compound 26 as described with respect to FIG. 5. As with process 150 illustrated FIG. 4, process 250 may further include the optional step 162, wherein the molding compound 110 is cured at step 162 following step 260 to form a electronic package 100 bonding together the backplate 12, connector shroud 14' (and associated circuitry 28, 30), substrate 24, and wirebond(s) 34.

Figure 7:
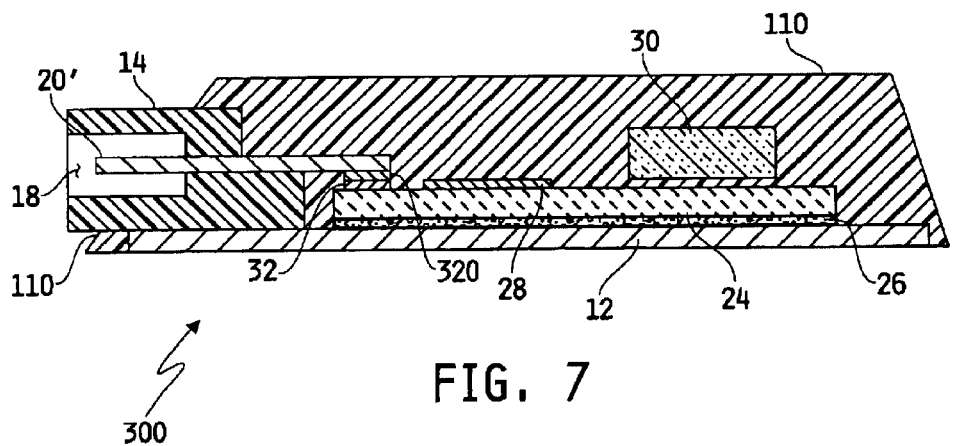
FIG. 7 is a cross-sectional view of yet another embodiment of an overmolded electronic package including a circuit-carrying substrate.
Figure 9:
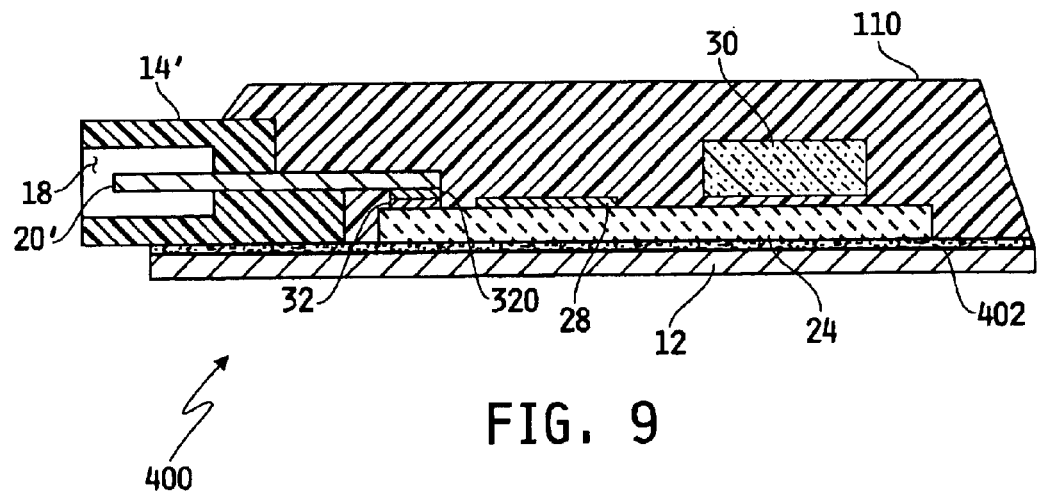
FIG. 9 is a cross-sectional view of still another embodiment of an overmolded electronic package including a circuit-carrying substrate.
Figure 10:
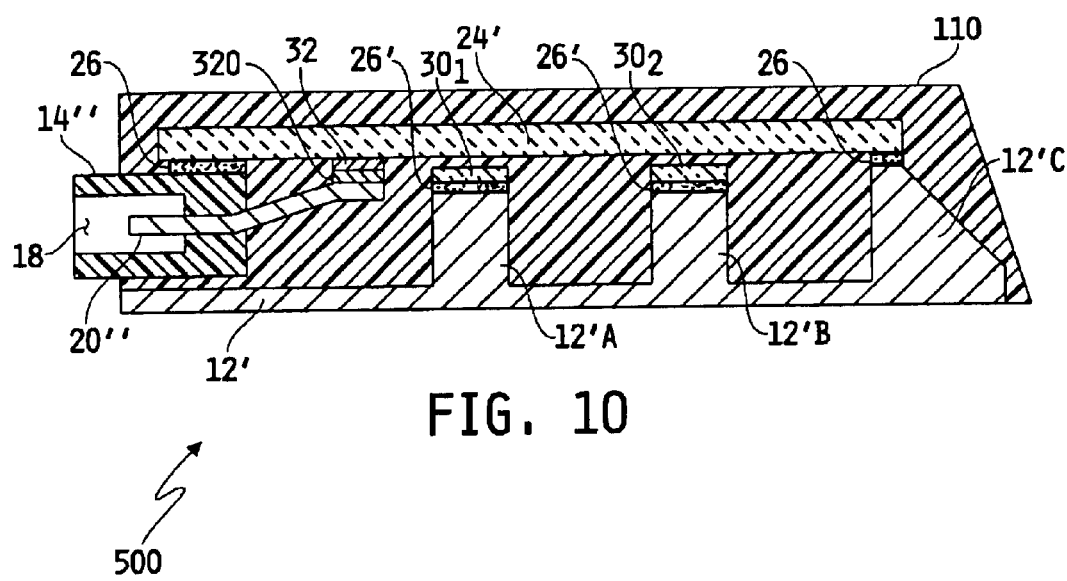
FIG. 10 is a cross-sectional view of a further embodiment of an overmolded electronic package including a circuit-carrying substrate.

With the formable molding compound 110 bonding and locking together the various components of electronic packages 100 and 200 as illustrated and described with respect to FIGS. 3 and 5 respectively, it may be desirable in some implementations to utilize different substrate/connector electrical interconnect schemes that have not been used heretofore in conventional electronic packages due to the unavailability of adequate interconnect strain relief and/or mechanical support mechanisms in such conventional electronic packaging arrangements. A number of alternate interconnect examples are illustrated in FIGS. 7, 9 and 10, and all such examples utilize a direct electrical and mechanical connection between the connector pins extending from the connector shroud and the corresponding bonding locations defined on the substrate. The mechanical support provided by the rigidly formed molding compound 110 effectively reduces stress from any such direct connect arrangements.

Referring now to FIG. 7, a cross-sectional view of another embodiment of an overmolded electronic package 300 is shown including the circuit-carrying substrate 24. Some of the elements of FIG. 7 are identical to those illustrated in FIGS. 1, 3, and/or 5, and like numbers are therefore used to identify like components. For example, package 300 includes a backplate 12 mounted via a suitable bonding medium 26 to the circuit-carrying substrate 24. In this case, the connector shroud 14' need not be affixed to the backplate 12 since a direct electrical and mechanical connection will be made between the connector pins 34 and the corresponding bonding locations 32 formed on the substrate 24. The bonding medium between the connector shroud 14' and the backplate 12 may thus be eliminated.

In the embodiment illustrated in FIG. 7, the connector pins 20' extend beyond the connector shroud 14' toward the substrate 24, and are aligned with corresponding ones of the bonding locations 32 formed on the substrate 24. A suitable bonding medium 320, e.g., solder bump, solder paste, electrically conductive epoxy or the like, is positioned between each of the connector pins 20' and corresponding ones of the bonding locations 32 formed on the substrate 24. Electrical and mechanical connection is made therebetween via a suitable bonding process, e.g., solder reflow, epoxy cure, welding, etc., and the entire subassembly comprising the backplate 12, connector shroud 14', substrate 24 and connector pins 20' is then overmolded with the rigidly formable molding compound 110 to form the electronic package 300.

Figure 8:
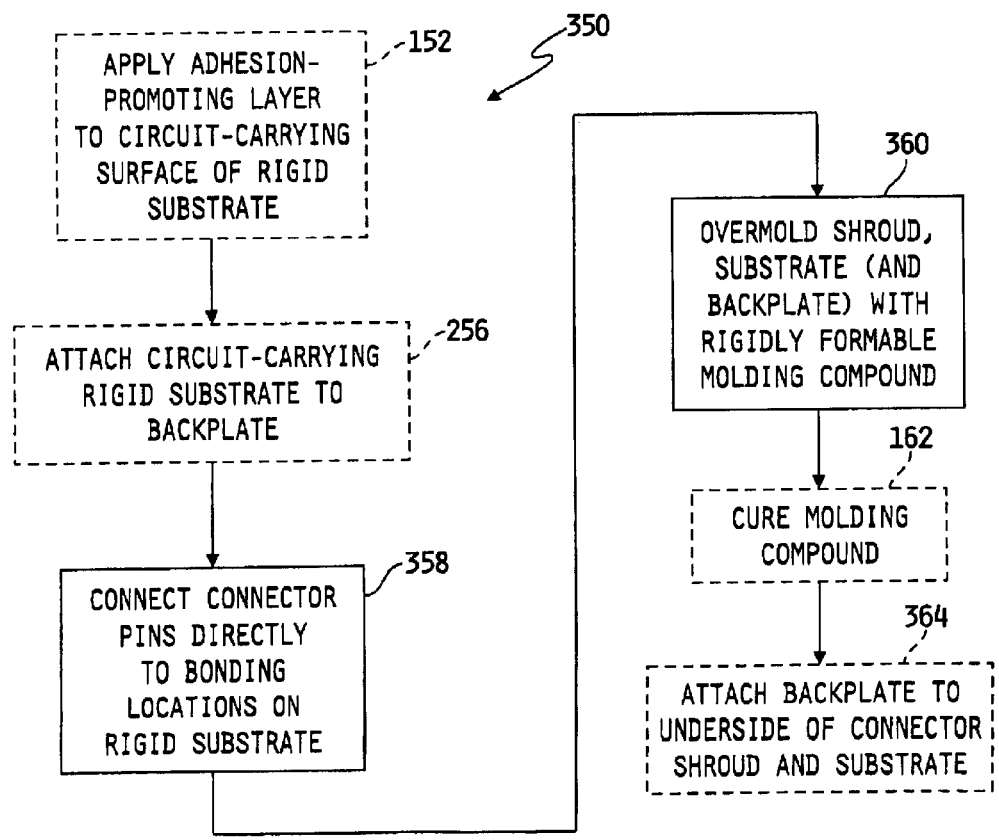
FIG. 8 is a flowchart illustrating a process for constructing the overmolded electronic package of FIGS. 7, 9 and 10.

Referring now to FIG. 8, a flowchart is shown illustrating a process 350 for constructing the overmolded electronic package 300 of FIG. 7. Some of the steps of process 350 are identical to those of process 250 illustrated in FIG. 6, and like numbers are accordingly used in FIG. 8 to identify like steps. As with processes 150 and 250 process 350 begins with the optional step 152 of applying an adhesion-promoting layer to the circuit-carrying surface of substrate 24. Thereafter at step 256, or beginning with step 256 if step 152 is omitted, the circuit-carrying substrate 24 is attached to the backplate 12 via a suitable bonding medium 26. Step 256 is illustrated with a dashed-line box because process 350 may also be used to construct electronic packages 400 and 500 illustrated in FIGS. 9 and 10 respectively, and step 256 is omitted in at least one of these embodiment as will be described in greater detail hereinafter. Step 256 is carried out in process 350 as it relates to construction of the electronic package 300 illustrated in FIG. 7, however, and process 350 advances from step 356 to step 358 where the connector pins 20' are connected directly to the bonding locations 32 defined on the substrate 24 using any of the techniques described hereinabove. Thereafter at step 360, the entire subassembly comprising backplate 12, substrate 24 (and circuitry carried thereby), connector shroud 14' and connector pins 20' is overmolded with the rigidly formable molding compound 110, as described hereinabove, to form the electronic package 300. As with processes 150 illustrated FIG. 4 and 250 illustrated in FIG. 6, process 350 may further include optional step 162, wherein the molding compound 110 is cured at step 162 following step 360 to form a rigid electronic package 100 bonding together the backplate 12, connector shroud 14' (and associated circuitry 28, 30), substrate 24, and connector lead(s) 20'. Step 362 is omitted from process 350 in constructing the electronic package 300 illustrated in FIG. 7, and is accordingly represented with a dashed-line box 362.

Referring now to FIG. 9, a cross-sectional view of another embodiment of an overmolded electronic package 400 is shown including the circuit-carrying substrate 24. Some of the elements of FIG. 9 are identical to those illustrated in FIGS. 1, 3, 5 and/or 7 and like numbers are therefore used to identify like components. In this embodiment, neither the circuit-carrying substrate 24 nor the connector shroud 14' are attached to the backplate 12 prior to the overmolding process. Rather, in this embodiment, the connector pins 20' extending from the connector shroud 14' are electrically and mechanically connected directly to the bonding locations 32 defined on the substrate 24 via a suitable bonding medium 320 as described hereinabove with respect to FIG. 7. Thereafter, the subassembly comprising the substrate 24 (and circuitry carried thereby), connector shroud 14' and connector pins 20' is overmolded in a manner described hereinabove, the backplate 12 is then attached to the underside of the overmolded assembly via suitable compliant bonding medium 402, e.g., thermally conductive adhesive, epoxy or the like, to form the electronic package 400. Since the substrate 24 and molding compound 110 have similar CTEs (e.g., 6–10 ppm/° C.), minimal bending stress will be induced during temperature excursions in the subassembly comprising substrate 24, connector shroud 14', connector pins 20' and molding compound 110. Thereafter bonding the backplate 12 (e.g., Aluminum; CTE of approximately 24 ppm/° C.) to the subassembly via a suitably compliant bonding medium 402 effectively decouples the low CTE subassembly from the higher CTE backplate 12, thereby enhancing the subsequent reliability of the completed electronic package 400.

Referring again to FIG. 8, a modified version of process 350 may be used for constructing the overmolded electronic package 400 of FIG. 9. In constructing the electronic package 400, optional steps 156 and 162 may be carried out, but step 356 is omitted. Steps 358 and 360 are carried out as described with respect to FIG. 7, and an additional step 362 is added for this embodiment. At step 362, the backplate 12 is attached to the underside of the subassembly comprising the substrate 24, connector shroud 14', connector pins 20' and rigid molding compound 110 via compliant bonding medium 402.

Referring now to FIG. 10, a cross-sectional view of another embodiment of an overmolded electronic package 500 is shown including the circuit-carrying substrate 24. Some of the elements of FIG. 9 are identical to those illustrated in FIGS. 1, 3, and/or 5, and like numbers are therefore used to identify like components. The electronic package 500 is similar in construction to package 300 illustrated in FIG. 7, except in package 500 the substrate 24' is inverted before mounting it to the backplate 12' such that the circuitry (e.g., 28, 30) carried by the substrate 24' faces the backplate 12. In this embodiment, the backplate 12' is modified over that illustrated in FIG. 7, and includes a number of posts, here three such posts 12'A, 12'B and 12'C, extending upwardly from backplate 12' toward substrate 24'. A suitable bonding medium 26 is disposed between post 12'C and a corresponding location on the circuit-carrying surface of the substrate 24', and the substrate 24' is secured to post 12'C via medium 26. Posts 12'A and 12'B are included to provide thermally conductive heat sink structures for dissipating heat generated by corresponding heat-generating integrated circuits carried by substrate 24. In the embodiment illustrated in FIG. 10, for example the substrate 24' includes two such heat-generated integrated circuits $30_1$ and $30_2$, each mounted thereto in flip-chip fashion. A thermally conductive medium 26' is applied between each of the posts 12'A and 12'B and the corresponding flip-chips $30_1$ and $30_2$ to facilitate and promote thermal conduction therebetween. The thermally conductive medium 26' may be a thermally conductive adhesive, thermally conductive epoxy, thermally conductive grease or the like. In any case, the posts 12'A and 12'B not only provide individual heat sinks for heat generating circuits carried by the substrate 24', but also provide structural support for the substrate 24' relative to the backplate 12'.

The one or more connector pins 20" extending from the connector shroud 14" are electrically and mechanically connected to one or more corresponding bonding locations 32 defined on the substrate 24' via bonding medium 320 described hereinabove. In one embodiment, as illustrated in FIG. 10, the connector shroud 14" may be attached to the substrate 24' via a suitable bonding medium 26, or may alternatively be positioned adjacent on or near the substrate 24' with the electrical connection 320 holding the connector shroud in place prior to the overmolding process. After the bonds are made between the bonding locations 32 defined on the circuitry-carrying surface of the substrate 24' and the corresponding connector pins 20" as described hereinabove, and any bonding mediums; e.g., 26 and/or 26' are cured, the entire subassembly comprising backplate 12', connector shroud 14", substrate 24' and connector pins 20" is overmolded with the rigidly formable molding compound 110 to form the electronic package 500. The electronic package 500 may be constructed according to process 350 as this process is generally described with respect to construction of the electronic package 300 of FIG. 7.

While the invention has been illustrated and described in detail in the foregoing drawings and description, the same is to be considered as illustrative and not restrictive in character, it being understood that only illustrative embodiments thereof have been shown and described and that all changes and modifications that come within the spirit of the invention are desired to be protected. For example, in any of the embodiments illustrated in FIGS. 3, 5, 7 and/or 9, the substrate 24 may be extended so that the housing 14 or connector shroud 14' may be bonded or abutted to the substrate as illustrated and described with respect to FIG. 10. In any of these embodiments, the backplate 12 may accordingly be attached to the subassembly after the overmolding process as described with respect to one embodiment of FIG. 9, or may instead be attached to the substrate 24 as described.

What is claimed is:

1. A method of forming an overmolded electronic package including a circuit-carrying substrate, the method comprising the steps of:
   providing a housing defining a cavity therein and defining a connector shroud having a number of electrically conductive leads extending into said cavity;
   attaching said housing to a backplate;
   attaching said circuit-carrying substrate to said backplate within said housing cavity;
   connecting said number of electrically conductive leads to corresponding conductive pads defined on said substrate;
   filling said cavity with a rigidly formable molding compound; and
   curing said formable molding compound to rigidly bond together said backplate, said substrate and said housing to form said overmolded electronic package.

2. The method of claim 1 wherein the connecting step comprises wirebonding said number of electrically conductive leads to said corresponding conductive pads defined on said substrate.

3. The method of claim 1 further including the step of applying an adhesion promoting layer to a circuit-carrying side of said substrate prior to the filling step, said adhesion promoting layer promoting adhesion between said circuit-carrying side of said substrate and said formable molding compound.

4. The method of claim 1 wherein a circuit-carrying side of said substrate has at least one flip chip mounted thereto, said at least one flip chip and said substrate defining a space therebetween;
   and wherein said formable molding compound is configured to flow between said at least one flip chip and said substrate and fill said space prior to the curing step.

5. The method of claim 1 wherein said formable molding compound is configured to exhibit a coefficient of thermal expansion that is near that of said substrate.

6. A method of forming an overmolded electronic package including a circuit-carrying substrate, the method comprising the steps of:
   providing a connector shroud having a number of electrically conductive leads extending therethrough;
   attaching said connector shroud to one of a backplate and the circuit-carrying substrate;
   attaching the circuit-carrying substrate to said backplate;
   connecting said number of electrically conductive leads to corresponding conductive pads defined on said substrate; and
   overmolding at least said connector shroud and said circuit-carrying substrate with a rigidly formable molding compound to form said overmolded electronic package.

7. The method of claim 6 wherein the step of attaching said connector shroud comprises attaching said connector shroud only to said backplate;
   and wherein the overmolding step includes overmolding said connector shroud, said circuit-carrying substrate and said backplate with said rigidly formable molding compound to form said overmolded electronic package.

8. The method of claim 6 wherein the step of attaching said connector shroud comprises attaching said connector shroud only to said circuit-carrying substrate;
   and wherein the overmolding step includes overmolding said connector shroud, said circuit-carrying substrate and said backplate with said rigidly formable molding compound to form said overmolded electronic package.

9. The method of claim 6 wherein the step of attaching said connector shroud comprises attaching said connector shroud only to said circuit-carrying substrate;
   and wherein the overmolding step includes overmolding only said connector shroud and said circuit-carrying substrate with said rigidly formable molding compound to form said overmolded electronic package;
   and wherein the step of attaching said circuit-carrying substrate is executed after the overmolding step.

10. The method of claim 6 wherein the connecting step comprises wirebonding said number of electrically conductive leads to said corresponding conductive pads defined on said substrate.

11. The method of claim 6 further including the step of applying an adhesion promoting layer to a circuit-carrying side of said substrate prior to the overmolding step, said adhesion promoting layer promoting adhesion between said circuit-carrying side of said substrate and said formable molding compound.

12. The method of claim 6 wherein a circuit-carrying side of said substrate has at least one flip chip mounted thereto, said at least one flip chip and said substrate defining a space therebetween;
   and wherein said formable molding compound is configured to flow between said at least one flip chip and said substrate and fill said space.

13. The method of claim 6 wherein said formable molding compound is configured to exhibit a coefficient of thermal expansion that is near that of said substrate.

14. A method of forming an overmolded electronic package including a circuit-carrying substrate, the method comprising the steps of:
   attaching the circuit-carrying substrate to a backplate;
   providing a connector shroud having a number of electrically conductive leads extending therethrough;
   connecting said number of electrically conductive leads to corresponding conductive pads defined on said substrate; and
   overmolding at least said connector shroud and said circuit-carrying substrate with a rigidly formable molding compound to form said overmolded electronic package.

15. The method of claim 14 wherein the overmolding step includes overmolding said connector shroud, said circuit-carrying substrate and said backplate with said rigidly formable molding compound to form said overmolded electronic package.

16. The method of claim 14 wherein the overmolding step includes overmolding only said connector shroud and said circuit-carrying substrate with said rigidly formable molding compound to form said overmolded electronic package;
   and wherein the step of attaching said circuit-carrying substrate is executed after the overmolding step.

17. The method of claim 14 wherein the connecting step comprises:
- providing a solder mass between each of said number of electrically conductive leads and said corresponding conductive pads defined on said substrate; and
- reflowing said solder masses to electrically and mechanically connect said number of electrically conductive leads to said corresponding conductive pads defined on said substrate.

18. The method of claim 14 further including the step of applying an adhesion promoting layer to a circuit-carrying side of said substrate prior to the overmolding step, said adhesion promoting layer promoting adhesion between said circuit-carrying side of said substrate and said formable molding compound.

19. The method of claim 14 wherein a circuit-carrying side of said substrate has at least one flip chip mounted thereto, said at least one flip chip and said substrate defining a space therebetween;
- and wherein said formable molding compound is configured to flow between said at least one flip chip and said substrate and fill said space.

20. The method of claim 14 wherein said formable molding compound is configured to exhibit a coefficient of thermal expansion that is near that of said substrate.

21. A method of forming an overmolded electronic package including a circuit-carrying substrate, the method comprising the steps of:
- providing a connector shroud having a number of electrically conductive leads extending therethrough;
- connecting said number of electrically conductive leads to corresponding conductive pads defined on the circuit-carrying substrate;
- overmolding said connector shroud and circuit-carrying substrate with a rigidly formable molding compound while leaving at least partially exposed an underside of said connector shroud and an underside of said circuit-carrying substrate; and
- attaching a backplate to said undersides of said connector shroud and said substrate after the overmolding step to form said overmolded electronic package.

22. The method of claim 21 wherein the connecting step comprises:
- providing a solder mass between each of said number of electrically conductive leads and said corresponding conductive pads defined on said substrate; and
- reflowing said solder masses to electrically and mechanically connect said number of electrically conductive leads to said corresponding conductive pads defined on said substrate.

23. The method of claim 21 further including the step of applying an adhesion promoting layer to a circuit-carrying side of said substrate prior to the overmolding step, said adhesion promoting layer promoting adhesion between said circuit-carrying side of said substrate and said formable molding compound.

24. The method of claim 21 wherein a circuit-carrying side of said substrate has at least one flip chip mounted thereto, said at least one flip chip and said substrate defining a space therebetween;
- and wherein said formable molding compound is configured to flow between said at least one flip chip and said substrate and fill said space.

25. The method of claim 21 wherein said formable molding compound is configured to exhibit a coefficient of thermal expansion that is near that of said substrate.

26. A method of forming an overmolded electronic package including a circuit-carrying substrate having a number of flip-chip circuits mounted thereto, the method comprising the steps of:
- providing a backplate having a number of thermally conductive posts extending therefrom;
- attaching the circuit-carrying substrate to said backplate with each of said number of flip-chip circuits mounted to a corresponding one of said number of thermally conductive posts;
- providing a connector shroud having a number of electrically conductive leads extending therethrough;
- connecting said number of electrically conductive leads to corresponding conductive pads defined on said substrate; and
- overmolding said connector shroud, said circuit-carrying substrate and said backplate with a rigidly formable molding compound to form said overmolded electronic package.

27. The method of claim 26 further including the step of applying a formable thermally conductive medium between each of said number of flip-chip circuits and a corresponding one of said number of thermally conductive posts.

28. The method of claim 26 further including the step of attaching said connector shroud to said circuit-carrying substrate.

29. The method of claim 26 further including the step of applying an adhesion promoting layer to a circuit-carrying side of said substrate prior to the overmolding step, said adhesion promoting layer promoting adhesion between said circuit-carrying side of said substrate and said formable molding compound.

30. The method of claim 26 wherein each of said number of flip-chip circuits and said substrate define a space therebetween;
- and wherein said formable molding compound is configured to flow between said number of flip-chip circuits and said substrate and fill said spaces.

31. The method of claim 26 wherein said formable molding compound is configured to exhibit a coefficient of thermal expansion that is near that of said substrate.

32. The method of claim 26 wherein the connecting step comprises:
- providing a solder mass between each of said number of electrically conductive leads and said corresponding conductive pads defined on said substrate; and
- reflowing said solder masses to electrically and mechanically connect said number of electrically conductive leads to said corresponding conductive pads defined on said substrate.

* * * * *